United States Patent
Hsu et al.

(10) Patent No.: US 8,766,456 B2
(45) Date of Patent: Jul. 1, 2014

(54) METHOD OF FABRICATING A SEMICONDUCTOR PACKAGE

(71) Applicant: Siliconware Precision Industries Co., Ltd., Taichung (TW)

(72) Inventors: Hsi-Chang Hsu, Taichung (TW); Hsin-Hung Chou, Taichung (TW); Hung-Wen Liu, Taichung (TW); Hsin-Yi Liao, Taichung (TW); Chiang-Cheng Chang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 13 days.

(21) Appl. No.: 13/660,223

(22) Filed: Oct. 25, 2012

(65) Prior Publication Data

US 2014/0035156 A1 Feb. 6, 2014

(30) Foreign Application Priority Data

Aug. 3, 2012 (TW) .............................. 101127947 A

(51) Int. Cl.
*H01L 23/48* (2006.01)
*H01L 23/52* (2006.01)
*H01L 29/40* (2006.01)

(52) U.S. Cl.
USPC ............ 257/774; 257/777; 257/778; 438/127

(58) Field of Classification Search
USPC ............................ 257/774, 777, 778; 438/127
See application file for complete search history.

(56) References Cited

U.S. PATENT DOCUMENTS

| | | | | |
|---|---|---|---|---|
| 7,089,660 B2 * | 8/2006 | Hsu et al. | ......................... | 29/830 |
| 7,513,037 B2 * | 4/2009 | McCormack et al. | .......... | 29/852 |
| 8,492,902 B2 * | 7/2013 | Lee et al. | ....................... | 257/774 |
| 2003/0136577 A1 * | 7/2003 | Abe | .............................. | 174/255 |
| 2004/0178495 A1 * | 9/2004 | Yean et al. | ..................... | 257/723 |
| 2006/0175699 A1 * | 8/2006 | Lee | .................... | 257/700 |
| 2008/0185704 A1 * | 8/2008 | Hsu et al. | ...................... | 257/690 |
| 2009/0008793 A1 * | 1/2009 | Pohl et al. | ..................... | 257/777 |
| 2009/0039523 A1 * | 2/2009 | Jiang et al. | .................... | 257/777 |
| 2012/0104624 A1 * | 5/2012 | Choi et al. | .................... | 257/774 |
| 2012/0217644 A1 * | 8/2012 | Pagaila | ......................... | 257/774 |

* cited by examiner

*Primary Examiner* — Karen Kusumakar
(74) *Attorney, Agent, or Firm* — Edwards Wildman Palmer LLP; Peter F. Corless; Steven M. Jensen

(57) ABSTRACT

A method of fabricating a semiconductor package is provided, including: disposing a semiconductor element on a carrier; forming an encapsulant on the carrier to encapsulant the semiconductor element; forming at least one through hole penetrating the encapsulant; forming a hollow conductive through hole in the through hole and, at the same time, forming a circuit layer on an active surface of the semiconductor element and the encapsulant; forming an insulating layer on the circuit layer; and removing the carrier. By forming the conductive through hole and the circuit layer simultaneously, the invention eliminates the need to form a dielectric layer before forming the circuit layer and dispenses with the conventional chemical mechanical polishing (CMP) process, thus greatly improving the fabrication efficiency.

20 Claims, 4 Drawing Sheets

METHOD OF FABRICATING A SEMICONDUCTOR PACKAGE

CROSS-REFERENCES TO RELATED APPLICATIONS

This application claims under 35 U.S.C. §119(a) the benefit of Taiwanese Application No. 101127947, filed Aug. 3, 2012, the entire contents of which is incorporated herein by reference.

BACKGROUND OF THE INVENTION

1. Field of the Invention

The present invention relates to semiconductor packages and methods of fabricating the same, and, more particularly, to a wafer-level semiconductor package used for 3D packaging and a method of fabricating the same.

2. Description of Related Art

Wafer level packaging (WLP) involves packaging and testing integrated circuits at a wafer level. After a WLP process, wafer dicing can be performed to obtain a plurality of WLP packages substantially of the same size as dies. Since having advantages of small size and good electrical performance, the WLP packages have been widely applied to meet the miniaturization requirement of electronic devices.

Generally, WLP packages have fan-in and fan-out structures that meet the requirement of I/O counts and ball pitches. Further, by using through silicon via (TSV) or plated through hole (PTH) technologies, 3D WLP packages have been developed to meet the continuously increased density of circuits and miniaturization of package sizes.

Referring to FIG. 1A, to fabricate a conventional semiconductor package 1, a plurality of through holes 120 are formed in an encapsulant 12 encapsulating a plurality of semiconductor elements 10.

Referring to FIG. 1B, a plurality of conductive through holes 15 are formed in the through holes 120 by electroplating.

Referring to FIG. 1C, a dielectric layer 16, a circuit layer 17 and an insulating layer 18 are sequentially formed on the encapsulant 12.

However, an overburden may occur on the encapsulant during formation of the conductive through holes, and a metal layer may be formed on exposed conductive pads of the semiconductor elements. As such, a chemical mechanical polishing (CMP) process must be performed to remove the metal layer on the conductive pads so as to prevent short circuits from occurring between the conductive pads, thereby increasing the fabrication cost. In addition, since a redistribution layer (RDL) requires forming a dielectric layer before forming a circuit layer, the fabrication cost is further increased.

Therefore, there is a need to provide a semiconductor package and a fabrication method thereof so as to overcome the above-described drawbacks.

SUMMARY OF THE INVENTION

In view of the above-described drawbacks, the present invention provides a method of fabricating a semiconductor package, which comprises: providing a semiconductor element having opposite active and non-active surfaces, and disposing the semiconductor element on a carrier through the non-active surface thereof; forming an encapsulant on the carrier for encapsulating side surfaces of the semiconductor element, wherein the encapsulant has opposite first and second surfaces, and the active surface of the semiconductor element is exposed from the first surface of the encapsulant; forming at least one through hole penetrating the encapsulant; forming a hollow conductive through hole in the through hole, and at the same time forming a circuit layer on the active surface of the semiconductor element and the first surface of the encapsulant; forming a first insulating layer on the circuit layer and in the hollow conductive through hole; and removing the carrier.

In the above-described method, the first surface of the encapsulant can be flush with the active surface of the semiconductor element.

After forming the at least one through hole penetrating the encapsulant, the method can further comprise forming a patterned resist layer on the active surface of the semiconductor element and the first surface of the encapsulant such that portions of the active surface of the semiconductor element and the first surface of the encapsulant are exposed from the patterned resist layer so as for the circuit layer to be formed thereon; and after forming the hollow conductive through hole and the circuit layer, the method can further comprise removing the patterned resist layer.

After forming the at least one through hole penetrating the encapsulant and before forming the patterned resist layer, the method can further comprise forming a seed layer on the active surface of the semiconductor element and the first surface of the encapsulant and in the through hole. The seed layer and the circuit layer can be made of copper.

In the above-described method, the through hole can be formed by laser drilling.

In an embodiment, the first insulating layer is made of a dry film, and the dry film is filled in the hollow conductive through hole by lamination.

Before removing the earlier, the method can further comprise forming a plurality of first openings in the first insulating layer for exposing a portion of the circuit layer. Thereafter, a plurality of conductive elements can be formed in the first openings. The conductive elements can be solder bumps or copper posts.

The method can further comprise forming a redistribution layer on the second surface of the encapsulant and forming a second insulating layer on the redistribution layer.

The present invention further provides a semiconductor package, which comprises: a semiconductor element having opposite active and non-active surfaces; an encapsulant encapsulating side surfaces of the semiconductor element, wherein the encapsulant has opposite first and second surfaces, and the active surface of the semiconductor element is exposed from the first surface of the encapsulant; at least one through hole formed in and penetrating the encapsulant; a hollow conductive through hole formed in the through hole; a circuit layer formed on the active surface of the semiconductor element and the first surface of the encapsulant and electrically connected to the hollow conductive through hole; and a first insulating layer formed on the circuit layer and filled in the hollow conductive through hole.

In the above-described package, the first surface of the encapsulant can be flush with the active surface of the semiconductor element, and the second surface of the encapsulant can be flush with the non-active surface of the semiconductor element.

The above-described package can further comprise a seed layer formed between the circuit layer and the encapsulant, between the circuit layer and the semiconductor element, and between the hollow conductive through hole and the encapsulant.

In the above-described package, the first insulating layer can be made of a dry film.

The above-described package can further comprise a plurality of first openings formed in the first insulating layer for exposing a portion of the circuit layer, and a plurality of conductive elements formed in the first openings and electrically connected to the circuit layer.

The above-described package can further comprise a redistribution layer formed on the second surface of the encapsulant, and a second insulating layer formed on the redistribution layer.

Therefore, the present invention forms the conductive through hole and the circuit layer simultaneously so as to eliminate the need to form a dielectric layer before forming the circuit layer and dispense with the conventional chemical mechanical polishing (CMP) process, thereby greatly improving the fabrication efficiency.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms, such as "upper", "lower", "one" etc., are merely for illustrative purpose and should not be construed to limit the scope of the present invention.

FIGS. 2A to 2H are schematic cross-sectional views showing a method of fabricating a semiconductor package 2 according to the present invention.

Figure 1A:
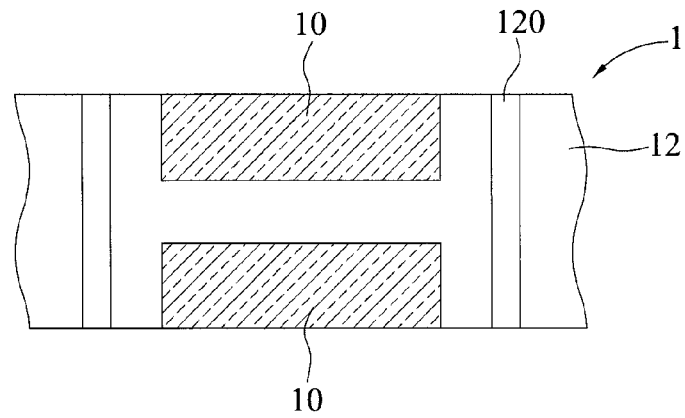
FIGS. 1A to 1C are schematic cross-sectional views showing a method of fabricating a semiconductor package according to the prior art.
Figure 1B:
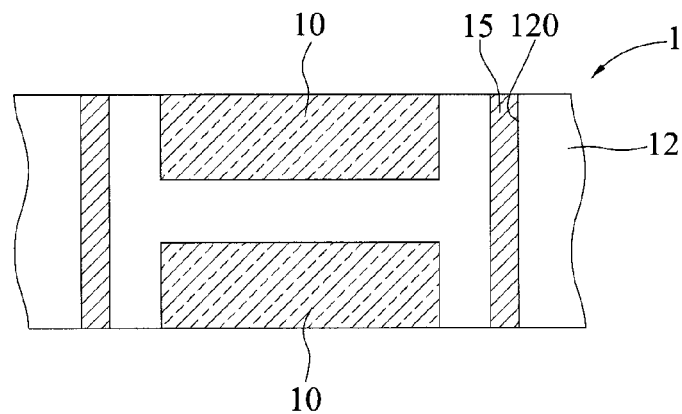
Figure 1C:
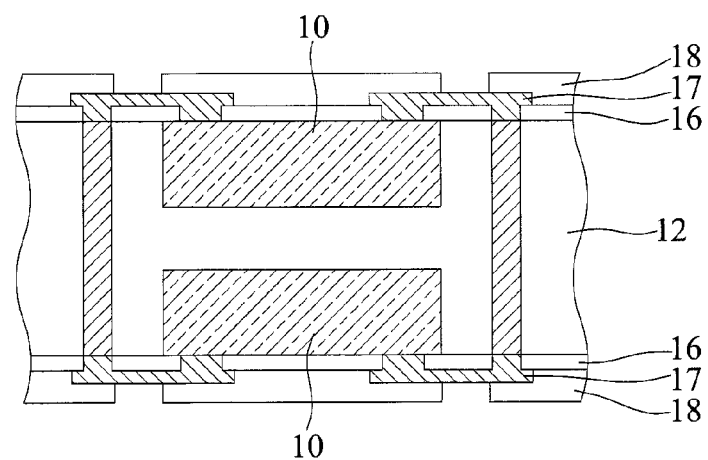
Figure 2A:
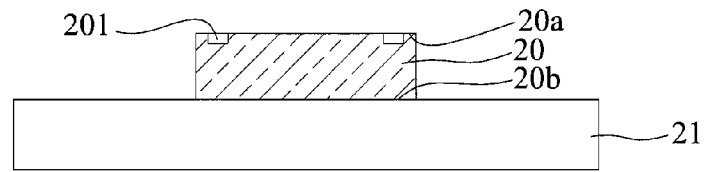
FIGS. 2A to 2I' are schematic cross-sectional views showing a method of fabricating a semiconductor package according to different embodiments of the present invention.

Referring to FIG. 2A, a semiconductor element 20 having an active surface 20a and an non-active surfaces 20b opposite to the active surface 20a is provided, and the semiconductor element 20 is disposed on a carrier 21 through the non-active surface 20b thereof. The active surface 20a of the semiconductor element 20 has a plurality of conductive pads 201.

In the present embodiment, the semiconductor element 20 is a semiconductor chip. The carrier 21 is made of FR4, glass or metal.

Figure 2B:
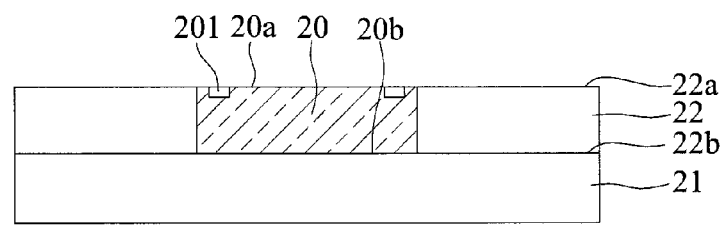

Referring to FIG. 2B, an encapsulant 22 is formed on the carrier 21 for encapsulating side surfaces of the semiconductor element 20. The encapsulant 22 has a first surface 22a flush with the active surface 20a of the semiconductor element 20 and a second surface 22b opposite to the first surface 22a.

In the present embodiment, the encapsulant 22 is made of an epoxy resin and formed by lamination or molding.

Figure 2C:
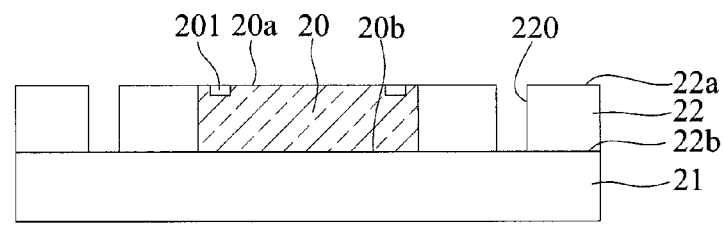

Referring to FIG. 2C, at least one through hole 220 is formed to penetrate the encapsulant 22.

In the present embodiment, the through hole 220 is formed by laser drilling.

Figure 2D:
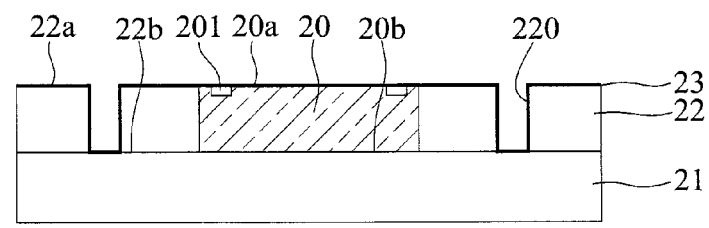

Referring to FIG. 2D, a seed layer 23 is formed on the active surface 20a of the semiconductor element 20 and the first surface 22a of the encapsulant 22 and in the through hole 220.

In the present embodiment, the seed layer 23 is made of copper. The seed layer 23 serves as a current conductive path for a subsequent electroplating process.

Figure 2E:
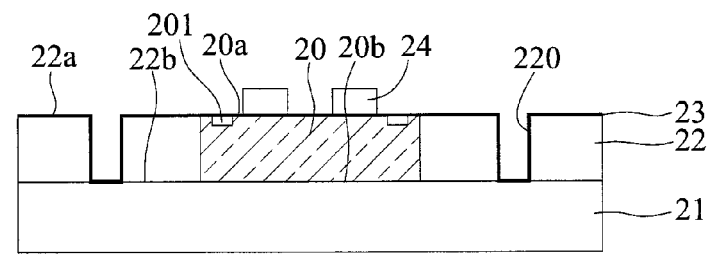

Referring to FIG. 2E, a patterned resist layer 24 is formed on the active surface 20a of the semiconductor element 20 and the first surface 22a of the encapsulant 22, and portions of the active surface 20a of the semiconductor element 20 and the first surface 22a of the encapsulant 22 are exposed from the patterned resist layer 23.

Figure 2F:
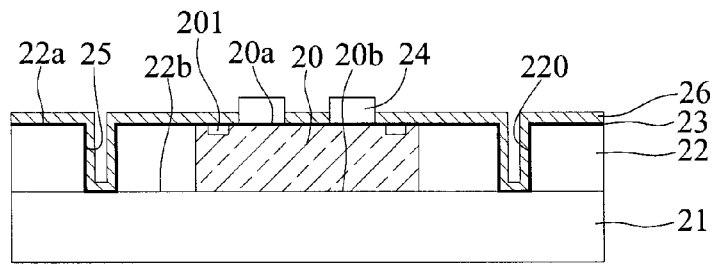

Referring to FIG. 2F, a hollow conductive through hole 25 is formed in the through hole 220, and, at the same time, a circuit layer 26 is formed on the exposed portions of the active surface 20a of the semiconductor element 20 and the first surface 22a of the encapsulant 22.

In the present embodiment, the circuit layer is made of copper.

Figure 2G:
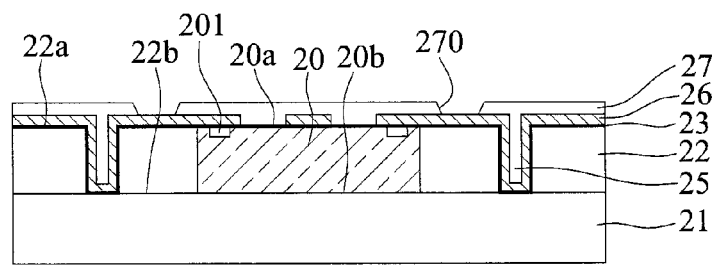

Referring to FIG. 2G the patterned resist layer 24 is removed. A first insulating layer 27 is then formed on the circuit layer 26, and a plurality of first openings 270 are formed in the first insulating layer 27 for exposing portions of the circuit layer 26.

In the present embodiment, the first insulating layer 27 is made of a dry film and filled in the hollow conductive through hole 25 by lamination.

Figure 2H:
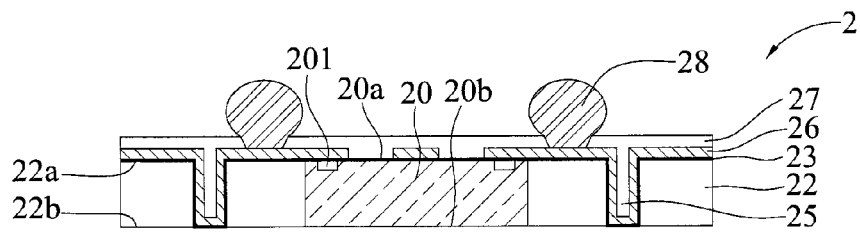
Figure 2H:
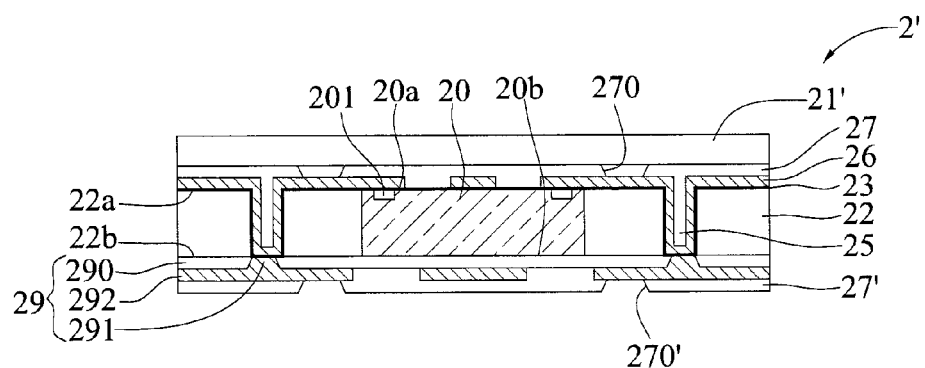

Referring to FIG. 2H, a plurality of conductive elements 28 are formed in the first openings 270 so as for the semiconductor package 2 to be disposed on an electronic device such as a circuit board. Then, the carrier 21 is removed.

In the present embodiment, the conductive elements 28 are solder bumps or copper posts.

In another embodiment, referring to FIG. 2H', after the first insulating layer 27 is formed on the circuit layer 26 and the first openings 270 are formed in the first insulating layer 27, a second carrier 21' is further disposed on the first insulating layer 27 and then the carrier 21 is removed.

Subsequently, a redistribution layer 29 is formed on the second surface 22b of the encapsulant 22. The redistribution layer 29 has a dielectric layer 290, a second circuit layer 292 formed on the dielectric layer 290, and a plurality of conductive vias 291 formed in the dielectric layer 290 for electrically connecting the conductive through hole 25 and the second circuit layer 292. Further, a second insulating layer 27' is formed on the redistribution layer 29 and has a plurality of second openings 270' for exposing portions of the second circuit layer 292.

Figure 2I:
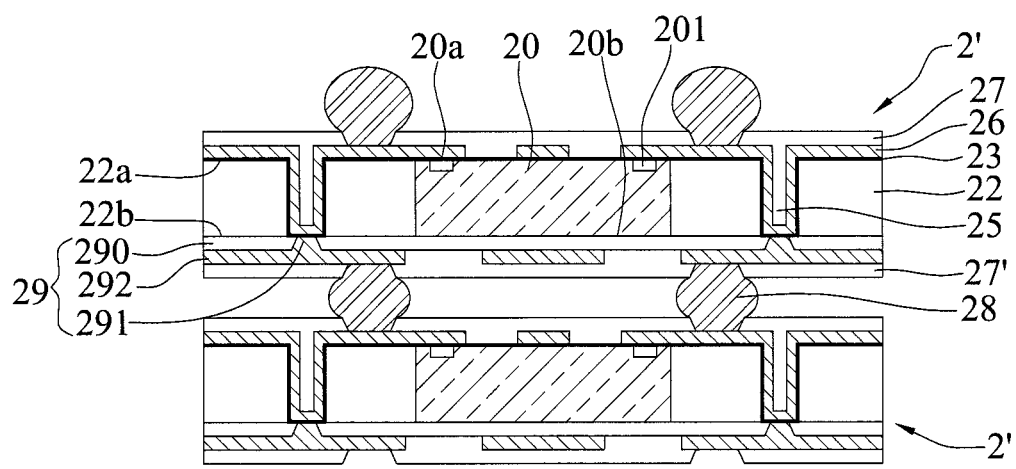

Referring to FIG. 2I', the second carrier 21' is removed, and a plurality of conductive elements 28 are formed in the first openings 270. As such, a plurality of semiconductor packages 2' can be stacked on one another through the conductive elements 28 so as to form a 3D package structure. In another embodiment, the semiconductor package 2' can be disposed on an electronic device such as a circuit board through the conductive elements 28.

The present invention provides a semiconductor package 2, 2', which has: a semiconductor element 20 having an active surface 20a with a plurality of conductive pads 201 and an non-active surfaces 20b opposite to the active surface 20a; an encapsulant 22 encapsulating side surfaces of the semiconductor element 20, wherein the encapsulant 22 has a first surface 22a flush with the active surface 20a of the semiconductor element 20 and a second surface 22b flush with the non-active surface 20b of the semiconductor element 20; at least one through hole 220 formed in and penetrating the encapsulant 22; a hollow conductive through hole 25 formed in the through hole 220; a circuit layer 26 formed on the active surface 20a of the semiconductor element 20 and the first surface 22a of the encapsulant 22 and electrically connected to the hollow conductive through hole 25; and a first insulating layer 27 formed on the circuit layer 26 and filled in the hollow conductive through hole 25.

The semiconductor package 2, 2' further has a seed layer 23 formed between the circuit layer 26 and the encapsulant 22, between the circuit layer 26 and the semiconductor element 20, and between the hollow conductive through hole 25 and the encapsulant 22.

In the present embodiment, the first insulating layer 27 is made of a dry film. The first insulating layer 27 has a plurality of first openings 270 exposing portions of the circuit layer 26, and a plurality of conductive elements 28 are formed on the exposed portions of the circuit layer 26.

The semiconductor package 2' further has a redistribution layer 29 formed on the second surface 22b of the encapsulant 22 and a second insulating layer 27' formed on the redistribution layer 29. The redistribution layer 29 has a dielectric layer 290, a second circuit layer 292 formed on the dielectric layer 290, and a plurality of conductive vias 291 formed in the dielectric layer 290 for electrically connecting the conductive through hole 25 and the second circuit layer 292. The second insulating layer 27' has a plurality of second openings 270' for exposing a portion of the second circuit layer 292. As such, the circuit layer 26 of a semiconductor package 2' can be electrically connected to the second circuit layer 292 of another semiconductor package 2' through the conductive elements 28, thereby forming a 3D package (as shown in FIG. 2I').

Therefore, by forming the conductive through hole and the circuit layer simultaneously, the present invention dispenses with the conventional RDL process for forming a dielectric layer before forming the circuit layer. Further, the present invention effectively prevents overburden and hence dispenses with the conventional CMP process, thereby greatly improving the fabrication efficiency and saving the fabrication cost.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method of fabricating a semiconductor package, comprising:
   providing a semiconductor element having opposite active and non-active surfaces, and disposing the semiconductor element on a carrier through the non-active surface thereof;
   forming an encapsulant on the carrier for encapsulating side surfaces of the semiconductor element, wherein the encapsulant has opposite first and second surfaces, and the active surface of the semiconductor element is exposed from the first surface of the encapsulant;
   forming at least one through hole penetrating the encapsulant;
   forming a hollow conductive through hole in the through hole, and at the same time forming a circuit layer on the active surface of the semiconductor element and the first surface of the encapsulant;
   forming a first insulating layer on the circuit layer and in the hollow conductive through hole; and
   removing the carrier.

2. The method of claim 1, wherein the first surface of the encapsulant is flush with the active surface of the semiconductor element.

3. The method of claim 1, after forming the at least one through hole penetrating the encapsulant, further comprising forming a patterned resist layer on the active surface of the semiconductor element and the first surface of the encapsulant such that portions of the active surface of the semiconductor element and the first surface of the encapsulant are exposed from the patterned resist layer so as for the circuit layer to be formed thereon; and after forming the hollow conductive through hole and the circuit layer, further comprising removing the patterned resist layer.

4. The method of claim 3, after forming the at least one through hole penetrating the encapsulant and before forming the patterned resist layer, further comprising forming a seed layer on the active surface of the semiconductor element and the first surface of the encapsulant and in the through hole.

5. The method of claim 4, wherein the seed layer is made of copper.

6. The method of claim 1, wherein the through hole is formed by laser drilling.

7. The method of claim 1, wherein the circuit layer is made of copper.

8. The method of claim 1, wherein the first insulating layer is made of a dry film.

9. The method of claim 8, wherein the dry film is filled in the hollow conductive through hole by lamination.

10. The method of claim 1, before removing the carrier, further comprising forming a plurality of first openings in the first insulating layer for exposing a portion of the circuit layer.

11. The method of claim 10, further comprising forming a plurality of conductive elements in the first openings.

12. The method of claim 11, wherein the conductive elements are solder bumps or copper posts.

13. The method of claim 10, further comprising:
   forming a redistribution layer on the second surface of the encapsulant; and
   forming a second insulating layer on the redistribution layer.

14. A semiconductor package, comprising:
   a semiconductor element having opposite active and non-active surfaces;
   an encapsulant encapsulating side surfaces of the semiconductor element, wherein the encapsulant has opposite first and second surfaces, and the active surface of the semiconductor element is exposed from the first surface of the encapsulant;
   at least one through hole formed in and penetrating the encapsulant;
   a hollow conductive through hole formed in the through hole;
   a circuit layer formed on the active surface of the semiconductor element and the first surface of the encapsulant and electrically connected to the hollow conductive through hole; and
   a first insulating layer formed on the circuit layer and filled in the hollow conductive through hole.

15. The semiconductor package of claim 14, wherein the first surface of the encapsulant is flush with the active surface of the semiconductor element.

16. The semiconductor package of claim 14, wherein the second surface of the encapsulant is flush with the non-active surface of the semiconductor element.

17. The semiconductor package of claim 14, further comprising a seed layer formed between the circuit layer and the encapsulant, between the circuit layer and the semiconductor element, and between the hollow conductive through hole and the encapsulant.

18. The semiconductor package of claim 14, wherein the first insulating layer is made of a dry film.

19. The semiconductor package of claim 14, further comprising: a plurality of first openings formed in the first insulating layer for exposing a portion of the circuit layer; and a plurality of conductive elements formed in the first openings and electrically connected to the circuit layer.

20. The semiconductor package of claim 14, further comprising: a redistribution layer formed on the second surface of the encapsulant; and a second insulating layer formed on the redistribution layer.

* * * * *